(12) United States Patent
Lee et al.

(10) Patent No.: US 9,040,010 B2
(45) Date of Patent: May 26, 2015

(54) APPARATUS FOR MANUFACTURING SINGLE CRYSTAL SILICON INGOT HAVING REUSABLE DUAL CRUCIBLE FOR SILICON MELTING

(75) Inventors: Jin-Seok Lee, Daejeon (KR); Bo-Yun Jang, Daejeon (KR); Young-Soo Ahn, Daejeon (KR)

(73) Assignee: KOREA INSTITUTE OF ENERGY RESEARCH, Yuseong-Gu, Daejeon (KR)

( * ) Notice: Subject to any disclaimer, the term of this patent is extended or adjusted under 35 U.S.C. 154(b) by 902 days.

(21) Appl. No.: 13/267,490

(22) Filed: Oct. 6, 2011

(65) Prior Publication Data

US 2012/0288432 A1    Nov. 15, 2012

(30) Foreign Application Priority Data

May 12, 2011    (KR) .................. 10-2011-0044753

(51) Int. Cl.
| | |
|---|---|
| *C01B 33/02* | (2006.01) |
| *C30B 15/18* | (2006.01) |
| *C30B 15/30* | (2006.01) |
| *C30B 15/10* | (2006.01) |
| *C30B 29/06* | (2006.01) |
| *C30B 35/00* | (2006.01) |

(52) U.S. Cl.
CPC ........... *C30B 29/06* (2013.01); *Y10T 117/1032* (2015.01); *Y10T 117/1072* (2015.01); *Y10T 117/1068* (2015.01); *C30B 15/10* (2013.01); *C30B 35/002* (2013.01)

(58) Field of Classification Search
CPC ...... C30B 15/10; C30B 29/06; C30B 35/002; C30B 15/12; Y10T 117/1032; Y10T 117/1068; Y10T 117/1072

USPC .......................... 117/208, 217, 218; 423/348
See application file for complete search history.

(56) References Cited

U.S. PATENT DOCUMENTS

2005/0279275 A1 * 12/2005 Holder ........................... 117/13

FOREIGN PATENT DOCUMENTS

| JP | 54124878 A | 9/1979 |
|---|---|---|
| JP | 62087489 A | 4/1987 |

(Continued)

OTHER PUBLICATIONS

Japanese Notice of Allowance dated Nov. 1, 2013, citing the above reference(s).

*Primary Examiner* — Michael Kornakov
*Assistant Examiner* — Hua Qi
(74) *Attorney, Agent, or Firm* — Lowe Hauptman & Ham, LLP

(57) ABSTRACT

The present disclosure provides an apparatus for manufacturing a single crystal silicon ingot having a dual crucible for silicon melting which can be reused due to a dual crucible structure. The apparatus includes a dual crucible for silicon melting, into which raw silicon is charged, a crucible heater heating the dual crucible to melt the raw silicon into molten silicon, a crucible drive unit controlling rotation and elevation of the dual crucible, and a pull-up drive unit disposed above the dual crucible and pulling up a seed crystal dipped in the molten silicon to produce a silicon ingot. The dual crucible has a container shape open at an upper side thereof, and includes a graphite crucible having an inclined surface connecting an inner bottom and an inner wall, and a quartz crucible inserted into the graphite crucible and receiving the raw silicon charged into the dual crucible.

9 Claims, 3 Drawing Sheets

(56) References Cited

FOREIGN PATENT DOCUMENTS

| | | |
|---|---|---|
| JP | 03045587 A | 2/1991 |
| JP | 08048598 A | 2/1996 |
| JP | 2002154892 A | 5/2002 |
| JP | 2005225718 A | 8/2005 |
| JP | 2006273666 A | 10/2006 |
| JP | 2006275426 A | 10/2006 |
| JP | 2011057469 A | 3/2011 |
| JP | 2011057471 A * | 3/2011 ............. C30B 29/06 |

* cited by examiner

APPARATUS FOR MANUFACTURING SINGLE CRYSTAL SILICON INGOT HAVING REUSABLE DUAL CRUCIBLE FOR SILICON MELTING

CROSS-REFERENCE TO RELATED APPLICATION

This application claims the benefit under 35 U.S.A. §119 of Korean Patent Application No. 10-2011-0044753, filed on May 12, 2011 in the Korean Intellectual Property Office, the entirety of which is incorporated herein by reference.

BACKGROUND

1. Technical Field

The present invention relates to an apparatus for manufacturing a single crystal silicon ingot, and more particularly to an apparatus for manufacturing a single crystal silicon ingot, which includes a reusable dual crucible capable of preventing infiltration of carbon impurities from a graphite crucible into molten silicon in a silicon melting process.

2. Description of the Related Art

A silicon ingot is prepared by dipping a seed crystal into molten silicon, which is formed by melting polysilicon and impurities in a crucible, using a pull-up driving apparatus, and by slowly pulling up the seed crystal while rotating the seed crystal and the crucible in opposite directions.

In order to manufacture a silicon ingot, a process of melting raw silicon is needed. In this case, since a graphite crucible causes infiltration of carbon and metal impurities into molten silicon, extensive studies have been conducted to develop a dual crucible structure which includes a quartz crucible inserted into the graphite crucible.

However, when the silicon melting process is performed using a dual crucible, molten silicon remaining in the dual crucible expands upon solidification thereof, causing failure of the quartz crucible. Thus, it is difficult to apply the dual crucible structure due to single use of the expensive quartz crucible.

BRIEF SUMMARY

An aspect of the present invention is to provide an apparatus for manufacturing a single crystal silicon ingot, which includes a reusable dual crucible for silicon melting configured to allow an expensive quartz crucible to be used at least twice.

In accordance with an aspect of the invention, an apparatus for manufacturing a single crystal silicon ingot having a reusable dual crucible for silicon melting includes a dual crucible for silicon melting, into which raw silicon is charged, a crucible heater heating the dual crucible to melt the raw silicon into molten silicon, a crucible drive unit controlling rotation and elevation of the dual crucible, and a pull-up drive unit disposed above the dual crucible and pulling up a seed crystal dipped in the molten silicon to produce a silicon ingot, wherein the dual crucible has a container shape open at an upper side thereof and includes a graphite crucible having an inclined surface connecting an inner bottom and an inner wall, and a quartz crucible inserted into the graphite crucible and receiving the raw silicon charged into the dual crucible.

BRIEF DESCRIPTION OF THE DRAWINGS

The above and other aspects, features, and advantages of the invention will become apparent from the following detailed description of exemplary embodiments in conjunction with the accompanying drawings, in which.

DETAILED DESCRIPTION

Exemplary embodiments of the invention will now be described in detail with reference to the accompanying drawings. It should be understood that the present invention is not limited to the following embodiments and may be embodied in different ways, and that the embodiments are given to provide complete disclosure of the invention and to provide thorough understanding of the invention to those skilled in the art. The scope of the invention is limited only by the accompanying claims and equivalents thereof.

Hereinafter, an apparatus for manufacturing a single crystal silicon ingot having a reusable dual crucible for silicon melting according to an exemplary embodiment of the invention will now be described in detail with reference to the accompanying drawings.

Figure 1:
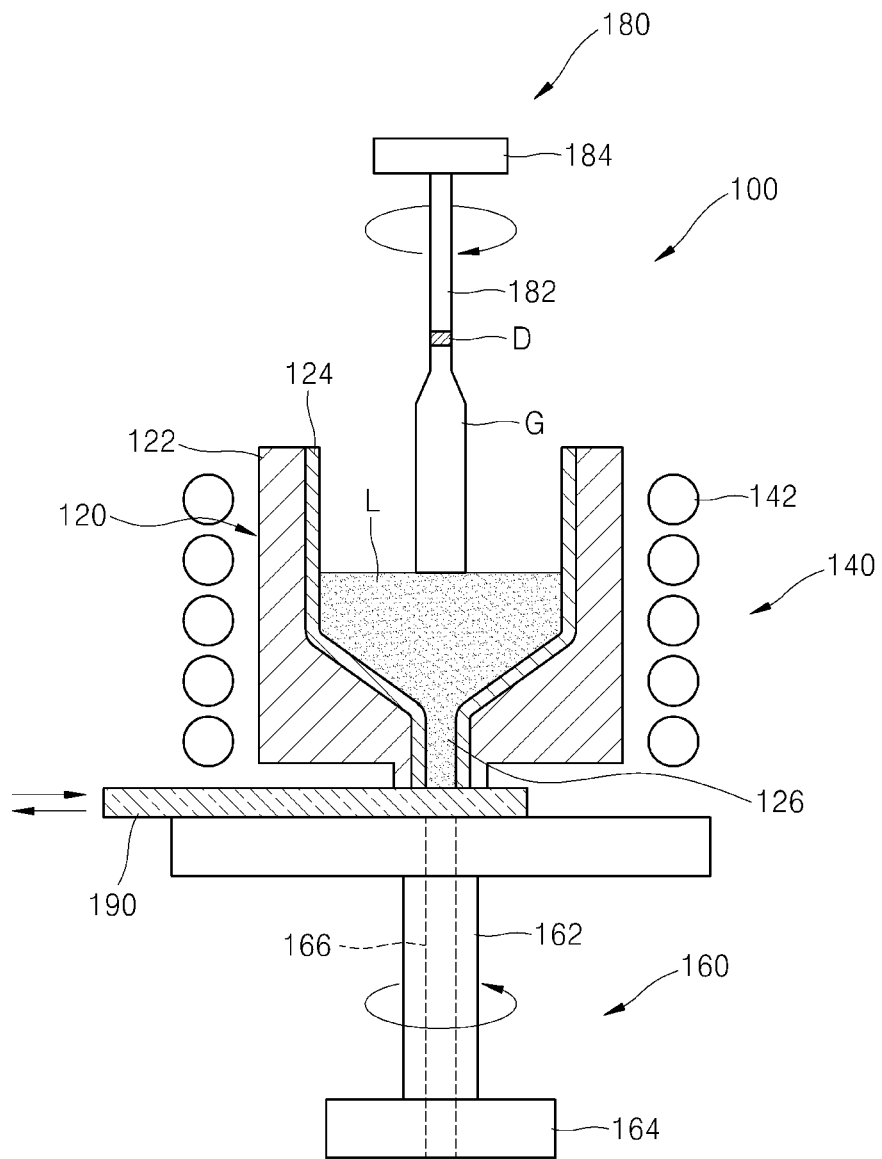
FIG. 1 is a cross-sectional view of an apparatus for manufacturing a single crystal silicon ingot having a dual crucible for silicon melting according to an exemplary embodiment of the present invention.

FIG. 1 is a cross-sectional view of an apparatus for manufacturing a single crystal silicon ingot having a dual crucible for silicon melting according to an exemplary embodiment of the invention.

Referring to FIG. 1, an apparatus 100 for manufacturing a single crystal silicon ingot includes a dual crucible 120 for silicon melting, a crucible heater 140, a crucible drive unit 160, and a pull-up drive unit 180.

The dual crucible 120 is provided with a predetermined amount of raw silicon material from a raw silicon storage part (not shown).

The dual crucible 120 may include a graphite crucible 122 and a quartz crucible 124 inserted into the graphite crucible 122. The graphite crucible 122 has a container shape, which has a discharge port 126 formed in an inner bottom thereof and is open at an upper side thereof, and may include an inclined surface which connects the inner bottom side and an inner wall of the graphite crucible 122. The quartz crucible 124 is inserted into the graphite crucible 122 and receives raw silicon charged into the dual crucible. The structure of the dual crucible 120 will be described in more detail below.

The crucible heater 140 heats the dual crucible 120 to melt raw silicon into molten silicon (L). The crucible heater 140 includes a coil 142 surrounding an outer wall of the dual crucible 120 and heats the dual crucible 120 having the raw silicon therein using the coil 142. The coil 142 may heat the dual crucible 120 in various manners, such as induction heating, resistance heating, and the like. The following description will be made with reference to induction heating as an illustrative example of heating.

The surface temperature of molten silicon (L) induction-heated in the dual crucible 120 may be kept at 1300 to 1500° C. Here, unlike metal, silicon has low electrical conductivity at about 700° C. or less, and thus it is difficult to directly heat silicon by electromagnetic induction. Thus, the raw silicon may be melted by heat from the dual crucible 120 in an indirect melting method. Although graphite forming the graphite crucible 122 disposed as an outer part of the dual crucible 120 is non-metal, it has remarkably high electrical conductivity and heat conductivity. Thus, the graphite crucible can be easily heated by electromagnetic induction.

The crucible drive unit 160 controls rotation and elevation of the dual crucible 120.

The crucible drive unit 160 may include a support chuck 162 which supports a lower side of the dual crucible 120, and a support chuck drive unit 164 which controls rotation and elevation of the support chuck 162.

The crucible drive unit 160 rotates the support chuck 162 and the dual crucible 120 supported by the support chuck 162 in a first direction using the support chuck drive unit 164 in a process of producing a silicon ingot G from molten silicon L.

Here, the crucible drive unit 160 may include a discharge hole 166 formed through the support chuck 162 and support chuck drive unit 164. The discharge hole 166 will be described in detail below.

The pull-up drive unit 180 is disposed above the dual crucible 120, and dips a seed crystal D in the molten silicon L produced via induction heating, followed by pulling up, thereby growing a silicon ingot G.

The pull-up drive unit 180 may include a seed crystal securing shaft 182 at a lower end thereof to secure the seed crystal D and a securing shaft drive unit 184 connected to the seed crystal securing shaft 182 to control rotation and elevation of the seed crystal securing shaft 182.

The seed crystal D functions as a seed for growing the silicon ingot G from the molten silicon L. Here, the seed crystal securing shaft 182 secures the seed crystal D and rotation and elevation thereof is controlled by the securing chuck drive unit 184.

Here, in a process of manufacturing a silicon ingot, raw silicon is melted to a proper degree by induction heating to form molten silicon, and a seed crystal D secured to the seed crystal securing shaft 182 is dipped into the molten silicon L by the securing shaft drive unit 184 connected to the seed crystal securing shaft 182 and is then slowly pulled up to allow a silicon single crystal to grow from one end of the seed crystal D, thereby manufacturing a silicon ingot G. Here, the seed crystal securing shaft 182 supports the weight of the silicon ingot G and may be formed of an elastic material.

In the process of manufacturing a silicon ingot, the pull-up drive unit 180 pulls up the silicon ingot G while rotating in a second direction opposite the first direction.

The apparatus 100 according to the present embodiment may further include a gate bar 190. The gate bar 190 is configured to perform positional motion, thereby functioning to open and close the discharge port 126 of the dual crucible 120. In this case, the gate bar 190 may perform positional motion in up, down, right, and left directions.

In the process of manufacturing a single crystal silicon ingot, the gate bar 190 closes the discharge port 126 such that the molten silicon L does not leak from the dual crucible 120. In this case, the gate bar 190 is located between the support chuck 162 and the dual crucible 120 and is rotated together with the support chuck 162 and the dual crucible 120 by the support chuck drive unit 164.

Here, the discharge hole 166 penetrating the support chuck 162 and the support chuck drive unit 164 may be formed at a position corresponding to the discharge port 126 of the dual crucible 120.

That is, in the process of manufacturing a single crystal silicon ingot, the gate bar 190 closes the discharge port 126 such that the molten silicon L does not leak from the dual crucible 120. On the contrary, after manufacturing the single crystal silicon ingot, the gate bar 190 opens the discharge port 126 for reuse of the dual crucible 120, so that the molten silicon L remaining in the dual crucible 120 is completely discharged to a lower part of the crucible drive unit 160 through the discharge port 126 and the discharge hole 166. The dual crucible 120 having substantially no molten silicon L left therein may be reused after a simple washing process.

Next, the dual crucible according to this embodiment will be described in detail with reference to FIGS. 2 and 3.

Figure 2:
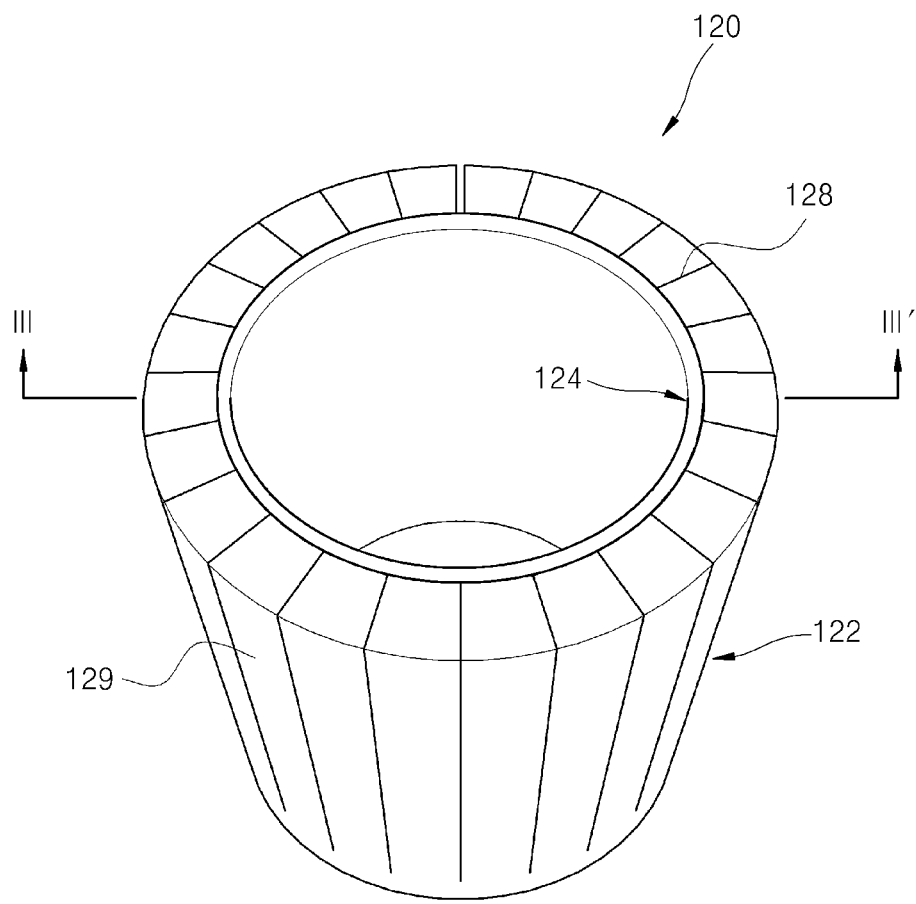
FIG. 2 is an enlarged perspective view of the dual crucible of FIG. 1.
Figure 3:
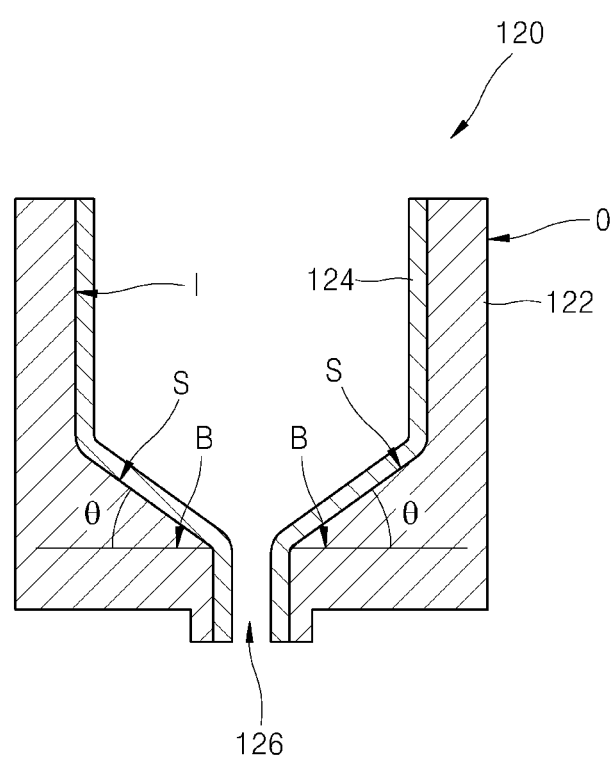
FIG. 3 is a cross-sectional view taken along line III-III' of FIG. 2.

Referring to FIGS. 2 and 3, the dual crucible 120 includes the graphite crucible 122 and the quartz crucible 124.

The graphite crucible 122 is open at an upper side and includes the inclined surface S connecting the inner bottom B and the inner wall I. The graphite crucible 122 may have a container shape open at an upper side thereof. In this case, the graphite crucible 122 may be designed to have various shapes in plan view, such as a polygonal shape, a circular shape, an oval shape, or the like.

Here, the graphite crucible 122 may include a plurality of slits 128 formed by longitudinally cutting part of a wall of the graphite crucible 122. The slits 128 may be configured to cut an external wall O and an internal wall I. Thus, the graphite crucible 122 is divided into segments 129 by the plurality of slits 128.

Further, the graphite crucible 122 may include the discharge port 126 penetrating the inner bottom B.

The quartz crucible 124 is inserted into the graphite crucible 122, and raw silicon is charged into the quartz crucible 124. Here, the quartz crucible 124 is formed in a similar shape to the graphite crucible 122. The quartz crucible 124 has excellent heat resistance, exhibits less thermal expansion, and is chemically stable as compared with graphite.

Accordingly, in the dual crucible 120 having the quartz crucible 124 inserted into the graphite crucible 122, when the raw silicon is heated to about 1412° C. or more by induction heating, the quartz crucible 124 inserted into the graphite crucible 122 functions as a shield which blocks carbon and metal impurities of the graphite crucible 122 from flowing into molten silicon, thereby preventing contamination of the molten silicon.

Specifically, the quartz crucible 124 may have a surface area corresponding to that of the graphite crucible 122. In this case, infiltration of carbon impurities from the graphite crucible 122 into the molten silicon may be thoroughly prevented.

Meanwhile, the inclined surface S may be formed at a gradient ($\theta$) of 3° or more with respect to the inner bottom B of the graphite crucible 122. Here, although not necessarily limited, a maximum gradient ($\theta$) may be less than 90°, considering that a maximum gradient between the inner bottom B and the inner wall I is 90°.

If the inclined surface S has a gradient ($\theta$) of less than 3°, driving force of the molten silicon traveling to the discharge port 126 is not great, causing part of the molten silicon to remain in the dual crucible 120.

If the inclined surface S has a gradient ($\theta$) of 3° or more, driving force of the molten silicon traveling to the discharge port 126 increases due to gravity, thereby allowing the molten silicon to be completely discharged through the discharge port 126 instead of remaining in the quartz crucible 124.

Thus, after a process of manufacturing a thin silicon substrate, the molten silicon is completely discharged through the discharge port instead of remaining in the dual crucible, so that the inner quartz crucible can be reused at least twice through a simple washing process.

A silicon wafer formed by slicing the silicon ingot prepared by the apparatus for manufacturing the single crystal silicon ingot including the dual crucible may have a sheet resistance of 80 to 200 Ω/m² regardless of reuse time of the dual crucible. This result will be further described with reference to Table 1.

Table 1 illustrates sheet resistances and standard deviations of single crystal silicon wafers prepared according to Examples 1 to 7 and Comparative Example 1. Single crystal silicon wafers of Examples 1 to 7 were manufactured by preparing single crystal silicon ingots using the apparatus for manufacturing the single crystal silicon ingot having the dual crucible, which was reused 1 to 7 times, respectively, and then slicing the respective single crystal silicon ingots to a thickness of 0.3 mm. A single crystal silicon wafer of Comparative Example 1 was manufactured by preparing a single crystal silicon ingot using the apparatus for manufacturing the single crystal silicon ingot having a graphite crucible only, and then slicing the single crystal silicon ingot to a thickness of 0.3 mm.

TABLE 1

|  | Reuse time | Sheet resistance (Ω/square) | Standard deviation (%) |
| --- | --- | --- | --- |
| Example 1 | 1 | 156 | 1.4 |
| Example 2 | 2 | 166 | 1.6 |
| Example 3 | 3 | 116 | 1.1 |
| Example 4 | 4 | 171 | 2.1 |
| Example 5 | 5 | 135 | 1.4 |
| Example 6 | 6 | 175 | 1.2 |
| Example 7 | 7 | 147 | 2.5 |
| Comparative Example 1 | — | 3 | 0.1 |

As shown in Table 1, the single crystal silicon wafers of Examples 1 to 7 had sheet resistances of several hundred Ω/m² regardless of reuse time. The single crystal silicon wafers of Examples 1 to 7 had standard deviations of 1.4, 1.6, 1.1, 2.1, 1.4, 1.2, and 2.5%, respectively, and the single crystal silicon wafer of Comparative Example 1 had a standard deviation of 0.1%.

On the other hand, when only the graphite crucible was used without the quartz crucible as in Comparative Example 1, the single crystal silicon wafer had a significantly low sheet resistance of several Ω/m², particularly a sheet resistance of 3 Ω/m². Consequently, it could be understood that carbon and metal impurities of the graphite crucible were infiltrated into the molten silicon and caused contamination of the single crystal silicon wafer.

However, the single crystal silicon wafers of Examples 1 to 7 had similar sheet resistances regardless of reuse time, which proves that there was no problem when the quartz crucible of the dual crucible for silicon melting was reused.

As such, in the dual crucible for silicon melting according to exemplary embodiments of the invention, an inclined surface connecting an inner bottom and an inner wall had a gradient of 3° or more so as to allow molten silicon to be completely discharged through a discharge port instead of remaining in the dual crucible, so that the inner quartz crucible of the dual crucible can be reused at least twice through a simple washing process after manufacture of a single crystal silicon ingot.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. An apparatus for manufacturing a single crystal silicon ingot, the apparatus comprising:
   a dual crucible configured to melt raw silicon charged into the dual crucible;
   a crucible heater configured to heat the dual crucible to melt the raw silicon into molten silicon;
   a crucible drive unit configured to control rotation and elevation of the dual crucible; and
   a pull-up drive unit disposed above the dual crucible, and configured to
      pull up a seed crystal dipped in the molten silicon, and
      produce a silicon ingot from the seed crystal,
   wherein the dual crucible has a container shape which is open at an upper side thereof, and comprises:
      a graphite crucible having a lower wall, an upper wall and an inclined surface connecting the lower wall; and
      a quartz crucible inserted into the graphite crucible, and configured to receive the raw silicon charged into the dual crucible,
   wherein the graphite crucible comprises a discharge port formed through the lower wall thereof.

2. The apparatus of claim 1, wherein the crucible heater comprise a coil surrounding an outside wall of the dual crucible.

3. The apparatus of claim 1, wherein the pull-up drive unit comprises:
   a seed crystal securing shaft configured to secure the seed crystal; and
   a securing shaft drive unit connected to the seed crystal securing shaft, and configured to control rotation and elevation of the seed crystal securing shaft.

4. The apparatus of claim 1, wherein the crucible drive unit comprises:
   a support chuck supporting a lower side of the dual crucible; and
   a support chuck drive unit configured to control rotation and elevation of the support chuck.

5. The apparatus of claim 1, wherein the graphite crucible comprises:
   a plurality of slits longitudinally extending through a wall of the graphite crucible.

6. The apparatus of claim 1, further comprising:
   a gate bar disposed between the dual crucible and the crucible drive unit, and configured to open and close the discharge port of the dual crucible.

7. The apparatus of claim 1, wherein the inclined surface of the graphite crucible has a gradient of 3 degrees or more with respect to the lower wall of the graphite crucible.

8. The apparatus of claim 1, wherein the quartz crucible is configured to be reused at least twice or more.

9. The apparatus of claim 1, wherein the quartz crucible has a surface area corresponding to that of the graphite crucible to prevent the graphite crucible from contacting the raw silicon.

* * * * *